HIGH-FREQUENCY ASTABLE NONSATURATING MULTIVIBRATOR

Filed Dec. 13, 1965 2 Sheets-Sheet 1

Nov. 21, 1967 D. T. KAN 3,354,409

HIGH-FREQUENCY ASTABLE NONSATURATING MULTIVIBRATOR

Filed Dec. 13, 1965 2 Sheets-Sheet 2

United States Patent Office 3,354,409
Patented Nov. 21, 1967

3,354,409
HIGH-FREQUENCY ASTABLE NONSATURATING MULTIVIBRATOR

David T. Kan, Fort Lee, N.J., assignor to Fairchild Camera and Instrument Corporation, a corporation of Delaware Filed Dec. 13, 1965, Ser. No. 513,477
8 Claims. (Cl. 331—113)

ABSTRACT OF THE DISCLOSURE

An astable multivibrator adjustable over a wide range of frequencies comprises a circuit for charging a capacitor in one direction including a resistor and a constant voltage drop diode and a circuit for charging the capacitor in the opposite direction including an adjustable timing resistor and a tunnel diode. A pair of switching transistors have a common emitter load and have their bases individually connected to the charging circuits at the junction of the capacitor and the diode. The circuit operates to switch back and forth between the two charging circuits as the transistors alternately become conductive.

This invention relates to high-frequency astable nonsaturating multivibrators and particularly to such multivibrators utilizing semiconductor devices and capable of operating at very high frequencies.

Heretofore, there have been proposed numerous types of astable multivibrator oscillator circuits including those incorporating semiconductor devices. In general, such circuits have comprised a pair of timing capacitors, each charged through a semiconductor operating between current saturation and cutoff. It is well known that a transistor operating at current saturation accumulates charge carriers in the base region which must be collected before the device is completely cut off. The time required to collect these accumulated charge carriers has put a lower limit on the switching time of the device and a corresponding limit upon the maximum operating frequency of the circuit.

Moreover, in prior astable multivibrator oscillators, the signal output circuit has been coupled to one of the timing capacitors or to a changing circuit associated therewith. As a consequence, the operating characteristics of the multivibrator, including its free-running frequency, have been affected by the impedance of the output circuit, so that such a multivibrator circuit is unsuitable for supplying loads of different impedances or loads of varying impedance.

It is an object of the invention therefore, to provide a new and improved high-frequency astable nonsaturating multivibrator which obviates one or more of the above limitations on prior circuits of this type.

It is another object of the invention to provide a new and improved high-frequency astable nonsaturating multivibrator incorporating semiconductor devices operating substantially below saturation and capable of oscillation at frequencies of the order of 50 mc.

It is still another object of the invention to provide a new and improved high-frequency astable nonsaturating multivibrator the operating characteristics of which, including its free-running frequency, are substantially independent of the value of the load impedance connected to its signal output circuit.

In accordance with the invention, there is provided a high-frequency astable nonsaturating multivibrator comprising a plurality of power supply terminals, a single storage capacitor, a first circuit coupled to one pair of the supply terminals for charging the capacitor in a given direction, such circuit including resistance means and a first electronic device having a substantially constant voltage drop during conduction and a second circuit coupled to a different pair of the supply terminals for charging the capacitor in the opposite direction, such circuit including resistance means and a second electronic device having a current-voltage characteristic of positive slope in two regions separated by a region of negative slope. The multivibrator further comprises a pair of electronic switching devices coupled to a pair of the supply terminals, such devices having conductivity-controlling electrodes and having a common load impedance, the conductivity-controlling electrode of one of the switching devices being coupled to the first charging circuit between the capacitor and the first electronic device and the conductivity-controlling electrode of the other of the switching devices being coupled to the second charging circuit between the capacitor and the second electronic device, the second electronic device switching between the two positive-slope regions of its characteristics in response to variations in the charge on the capacitor, and an output terminal coupled to an output electrode of one of the switching devices. The term "charging" is used herein and in the appended claims to include any varying of the charge on a capacitor, regardless of the sense of the change, that is, whether or not increasing or decreasing the charge thereon.

For a better understanding of the present invention, together with other and further objects thereof, reference is had to the following description, taken in connection with the accompanying drawings, while its scope will be pointed out in the appended claims.

Referring now to the drawings:

FIG. 2 is a graph of an operating characteristic of one of the semiconductor devices included in the circuit of FIG. 1, while

Figure 1:
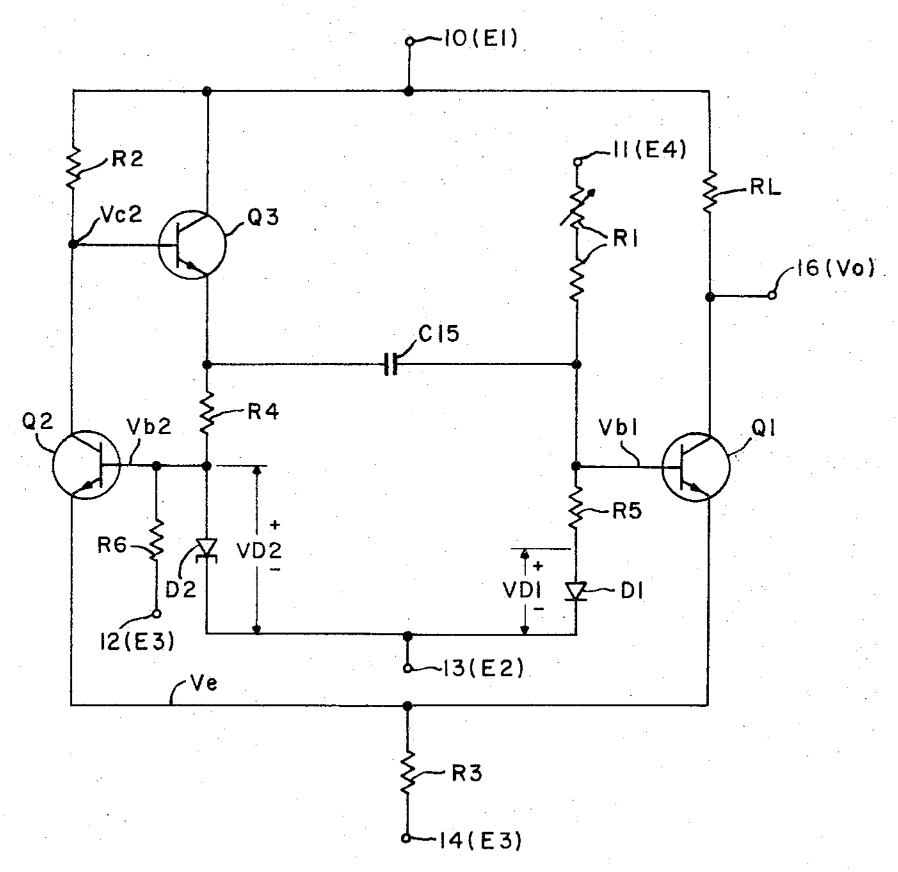
FIG. 1 is a schematic circuit diagram of a high-frequency astable nonsaturating multivibrator embodying the invention.

Referring now more particularly to FIG. 1 of the drawings, there is represented a high-frequency astable nonsaturating multivibrator comprising a series of supply terminals 10, 11, 12, 13, and 14 adapted to supply suitable operating potentials for the several portions of the circuit, as described hereinafter. The circuit further comprises a charging capacitor C15 and a first charging circuit for the capacitor including a timing resistor R5 and a first electronic device having a substantially constant voltage drop during conduction, specifically a semiconductor diode D1. This charging circuit is completed between the supply terminals 10 and 13 through a transistor Q3, referred to hereinafter. The capacitor C15 is provided with a second charging circuit including a timing resistor R1 including an adjustable portion and a fixed portion, as indicated, and an electronic device having a current-voltage characteristic of positive slope in two regions separated by a region of negative slope, specifically a semiconductor tunnel diode D2. This charging circuit is connected to the supply terminals 11 and 13 and includes also a feedback resistor R4 which controls the state of tunnel diode D2.

The multivibrator circuit of the invention further comprises a pair of switching devices having conductivity-controlling electrodes and a common load impedance. These switching devices may comprise a pair of transistors Q1, Q2 having base electrodes and a common emitter-load resistor R3. The conductivity-controlling electrode of one of the switching devices, specifically the base of the transistor Q1, is coupled to the semiconductor D1 through a resistor R5. The conductivity-controlling electrode of the other of the switching devices, that is, the base of the transistor Q2, is coupled directly to the semiconductor tunnel diode D2 and to the terminal of resistor R4 remote from capacitor C15. A suitable D.C. bias is applied to the base of transistor Q2 through an isolating resistor R6.

The multivibrator of the invention further comprises a buffer signal-repeater, such as a transistor Q3, having its base or conductivity-controlling electrode coupled to the collector of the switching transistor Q2 and having its collector and emitter output electrodes included in the first-described charging circuit of capacitor C15. The switching transistor Q1 has its collector and emitter electrodes connected between supply terminals 10 and 14 through a load resistor RL and the resistor R3. The output terminal 16 of the multivibrator is coupled directly to the collector electrode of the switching transistor Q1, that is, the output circuit of the multivibrator is connected across the load impedance RL.

Before describing in detail the operation of the above-described multivibrator, it will be helpful to consider certain of the operating characteristics of the semiconductor devices. The description may be aided by assuming semiconductor devices of the types given below and power supply terminals energized at the potentials indicated:

| | |
|---|---|
| Transistor Q1 | Silicon type 2N2369. |
| Transistor Q2 | Silicon type 2N2369. |
| Transistor Q3 | Silicon type 2N2369. |
| Diode D1 | Germanium type GPD-5. |
| Diode D2 | Silicon tunnel diode, type 1N4398. |

Supply potentials:

| | |
|---|---|
| Terminals **10** (E1) and **11** (E4) | 0 volt (ground). |
| Terminals **12** (E3) and **14** (E3) | —30 volts. |
| Terminal **13** (E2) | —7.5 volts. |

Among the significant operating characteristics of the devices are the following:

(a) The base-to-emitter voltage V*be* of a forward-biased silicon transistor is generally about 0.6 volt. If this parameter is reduced below 0.4 volt, the transistor will be cut off.

(b) The forward voltage drop of a germanium diode such as D1 is typically 0.25 volt.

Figure 2:
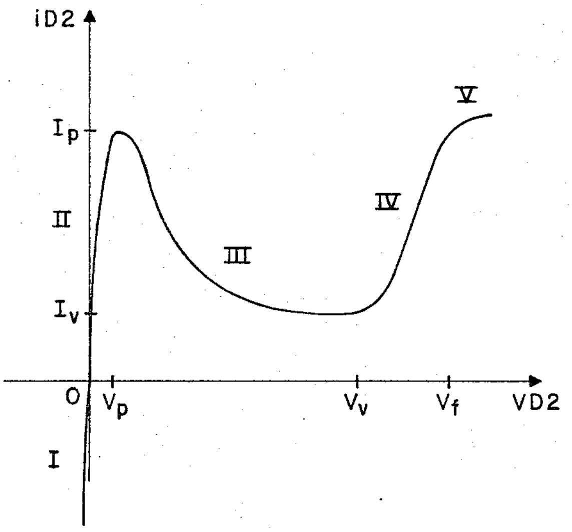

(c) The characteristic curve of a silicon tunnel diode such as D2 is shown in FIG. 2. It is noted that this characteristic includes regions I and II of positive slope which terminate at a current peak I*p* at a voltage V*p* of about 0.05 volt, followed by a region III of negative slope terminating at a voltage V*v* of about 0.6 volt and, in turn, followed by regions IV and V of positive slope terminating at a forward voltage V*f* of about 0.8 volt. The current peak I*p* may vary from a fraction of a milliampere to several amperes, depending upon the type of device. In region I, the tunnel diode conducts even when it is back-biased.

The circuit parameters are selected so that the following conditions obtain in the circuit:

(a) The emitter-follower transistor Q3 conducts during the entire cycle of oscillation.

(b) The collector of transistor Q2 never falls below E2 so that transistor Q2 never becomes saturated.

(c) $E1>E2>E3$ and $E4>E2$. A typical set of values of these potentials is given above.

Figure 3:
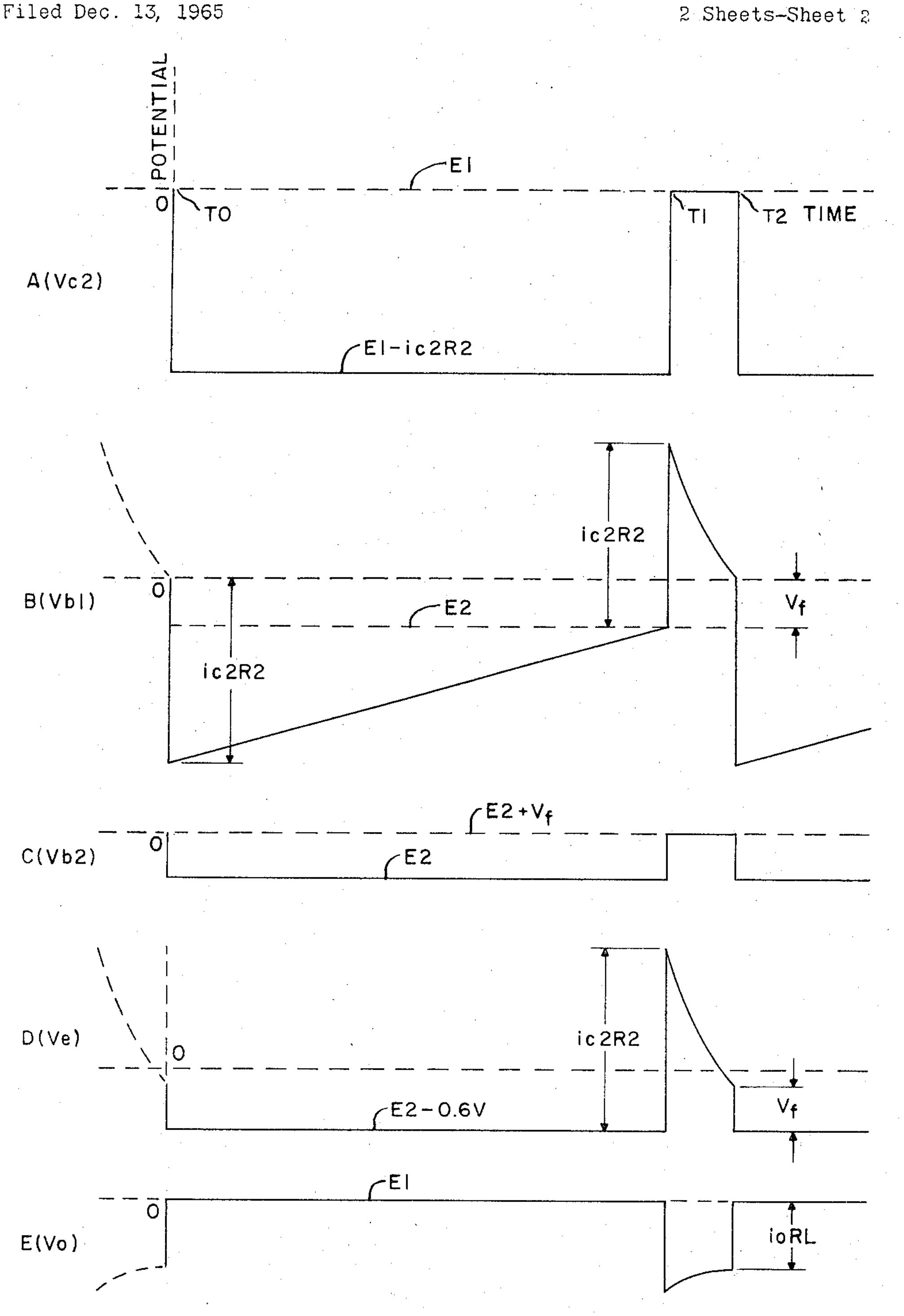
FIG. 3 is a series of curves representing certain operating characteristics of the circuit of FIG. 1.

The operation of the multivibrator circuit of FIG. 1 will be explained with reference to FIG. 3 comprising curves representing certain operating conditions in the circuit over one complete cycle. The explanation neglects transient conditions at starting and assumes that time T0 represents the commencement of one cycle of operation.

*I.—Prior to time T0*

At this time, transistor Q1 is conductive, transistor Q2 is cut off, and capacitor C15 is charging rapidly through transistor Q3, resistor R5, and diode D1. As the capacitor C15 charges, the potential of its right-hand terminal, V*b*1, falls, approaching E2, as indicated in curve B. At this time also, the potential on the base of transistor Q2, V*b*2, is E2 plus the voltage V*f* across tunnel diode D2 biased in region V, namely $E2+0.8$, as indicated in curve C of FIG. 3. During this period, the common emitter potential V*e* of the transistors is also falling as the current through Q1 and R3 diminishes, s indicated in curve D.

*II.—Time T0*

When the base voltage V*b*1 of transistor Q1 drops to approximately $E2+VF=Vb2$, remembering that V*b*2 is held at $E2+VF$, the base-to-emitter voltage of Q2 is now also 0.6 volt, Q2 becomes conductive, drawing current through R2, and dropping the potential of the left-hand terminal of capacitor C15 from approximately $E1-0.6$ to $E1-0.6-i2R2$. Since the potential across capacitor C15 cannot change instantly, the potential of its right-hand terminal V*b*1 drops by a corresponding amount, as indicated in curve B of FIG. 3. Thus, current is switched from the transistor Q1 to the transistor Q2 at the time T0 in FIG. 3.

*III. Time T0 to T1*

Transistor Q2 is now conductive, as noted above, and transistor Q1 is cut off. Capacitor C15 is now charged relatively slowly to opposite polarity through R1, R4, and D2 so that the base potential V*b*1 of transistor Q1 gradually rises towards E2, as shown in curve B of FIG. 3. During this portion of the cycle, the tunnel diode D2 is reversed-biased and operating in the region I, FIG. 2, in which the voltage drop across it is negligible, so that the base potential V*b*2 of transistor Q2 is effectively clamped at the potential E2 and the common emitter potential of the transistors Q1 and Q2 is held at approximately $E2-0.6$, as shown in curve D of FIG. 3. Further, as transistor Q1 is cut off, its collector potential V*c*1 rises to E1 and is maintained at such value during the remainder of this portion of the cycle, as indicated in curve E of FIG. 3.

*IV.—Time T1*

When the base potential V*b*1 of transistor Q1 approaches the value E2, the base-to-emitter voltage of Q1 is now approximately 0.6 volt and Q1 becomes conductive. Once Q1 conducts, the current in Q2 falls and the voltage at the collector of Q2 rises. This voltage rise, which is coupled to the bases of Q1 and Q2, raises V*b*1 and V*b*2, but the signal voltage transmitted to the base of Q1 from the collector of Q2 is greater than that transmitted to the base of Q2 because the latter is attenuated by the series divider consisting of R4 and tunnel diode D2. Thus Q2 is cut off and Q1 rendered conductive. When transistor Q2 becomes nonconductive, the current through resistor R2 is interrupted and the left-hand terminal on capacitor C15 rises by the value *ic*2R2 to approximately $E1-0.6$. The base potential V*b*2 of transistor Q2 is now at $E2+Vf$. Again, since the potential across capacitor C15 cannot change instantaneously, the potential of its right-hand terminal V*b*1 rises sharply by the same amount, as represented in curve B of FIG. 3. During this portion of the cycle, current flows through the resistor RL so that the output potential drops, as shown by curve E of FIG. 3. Also during this portion of the cycle, capacitor C15 is again charged rapidly through transistor Q3, resistor R5, and diode D1 until the base potential V*b*1 falls to approximately $E2+Vf=Vb2$, cutting off the transistor Q1 at time T2 and turning on transistor Q2, which corresponds to the same point in the cycle as the time T0, and the above-described cycle is repeated. At this point also, as the current through the transistor Q1 is interrupted, the output potential V*o* rises to E1, completing a pulse of output potential.

It has been determined that the circuit described is substantially completely insensitive to variations in the current gain $h_{FE}$ of the transistors Q1 and Q2. As a consequence, the frequency of the circuit may be adjusted continuously over a range of the order of 100,000 to 1 by variation of the value of resistor R1. The limit is, of course, the duration of the period T1 to T2, which is shown greatly exaggerated for ease of explanation.

While there has been described what is, at present, considered to be the preferred embodiment of the invention, it will be obvious to those skilled in the art that various changes and modifications may be made therein, without departing from the invention, and it is, therefore, aimed in the appended claims to cover all such changes and modifications as fall within the true spirit and scope of the invention.

What is claimed is:

1. A high-frequency astable nonsaturating multivibrator comprising:
a plurality of power supply terminals;
a single storage capacitor;
a first circuit coupled to one pair of said supply terminals for charging said capacitor in a given direction, said circuit including resistance means and a first electronic device having a substantially constant voltage drop during conduction;
a second circuit coupled to a different pair of said supply terminals for charging said capacitor in the opposite direction, said circuit including resistance means and a second electronic device having a current-voltage characteristic of positive slope in two regions separated by a region of negative slope;
a pair of electronic switching devices coupled to a pair of said supply terminals, said devices having conductivity-controlling electrodes and having a common load impedance;
the conductivity-controlling electrode of one of said switching devices being coupled to said first charging circuit between said capacitor and said first electronic device and the conductivity-controlling electrode of the other of said switching devices being coupled to said second charging circuit between said capacitor and said second electronic device;
said second electronic device switching between said two regions of its characteristic in response to variations in the charge on said capacitor;
and an output terminal coupled to an output electrode of one of said switching devices.

2. A high-frequency astable nonsaturating multivibrator comprising:
a plurality of power supply terminals;
a single storage capacitor;
a first circuit coupled to one pair of said supply terminals for charging said capacitor in a given direction, said circuit including resistance means and a first semiconductor diode having a substantially constant voltage drop during conduction;
a second circuit coupled to a different pair of said supply terminals for charging said capacitor in the opposite direction, said circuit including resistance means and a second semiconductor diode having a current-voltage characteristic of positive slope in two regions separated by a region of negative slope;
a pair of electronic switching devices coupled to a pair of said supply terminals, said devices having conductivity-controlling electrodes and having a common load impedance;
the conductivity-controlling electrode of one of said switching devices being coupled to said first charging circuit between said capacitor and said first diode and the conductivity-controlling electrode of the other of said switching devices being coupled to said second charging circuit between said capacitor and said second diode;

said second diode switching between said two regions of its characteristic in response to variations in the charge on said capacitor;
and an output terminal coupled to an output electrode of one of said switching devices.

3. A high-frequency astable nonsaturating multivibrator comprising:
a plurality of power supply terminals;
a single storage capacitor;
a first circuit coupled to one pair of said supply terminals for charging said capacitor in a given direction, said circuit including resistance means and a semiconductor diode;
a second circuit coupled to a different pair of said supply terminals for charging said capacitor in the opposite direction, said circuit including resistance means and a tunnel diode;
a pair of electronic switching devices coupled to a pair of said supply terminals, said devices having conductivity-controlling electrodes and having a common load impedance;
the conductivity-controlling electrode of one of said switching devices being coupled to said first charging circuit between said capacitor and said semiconductor diode and the conductivity-controlling electrode of the other of said switching devices being coupled to said second charging circuit between said capacitor and said tunnel diode;
said tunnel diode switching between said two regions of its characteristic in response to variations in the charge on said capacitor;
and an output terminal coupled to an output electrode of one of said switching devices.

4. A high-frequency astable nonsaturating multivibrator comprising:
a plurality of power supply terminals;
a single storage capacitor;
a first circuit coupled to one pair of said supply terminals for charging said capacitor in a given direction, said circuit including resistance means and a first electronic device having a substantially constant voltage drop during conduction;
a second circuit coupled to a different pair of said supply terminals for charging said capacitor in the opposite direction, said circuit including resistance means and a second electronic device having a current-voltage characteristic of positive slope in two regions separated by a region of negative slope;
a pair of transistors coupled to a pair of said supply terminals, said transistors having base electrodes and a common emitter load impedance;
the base of one of said transistors being coupled to said first charging circuit between said capacitor and said first electronic device and the base of the other of said transistors being coupled to said second charging circuit between said capacitor and said second electronic device;
said second electronic device switching between said two regions of its characteristic in response to variations in the charge on said capacitor;
and an output terminal coupled to an output electrode of one of said transistors.

5. A high-frequency astable nonsaturating multivibrator comprising:
a plurality of power supply terminals;
a single storage capacitor;
a first circuit coupled to one pair of said supply terminals for charging said capacitor in a given direction, said circuit including resistance means and a first electronic device having a substantially constant voltage drop during conduction;
a second circuit coupled to a different pair of said supply terminals for charging said capacitor in the opposite direction, said circuit including resistance means and a second electronic device having a current-voltage characteristic of positive slope in two regions separated by a region of negative slope;

a pair of electronic switching devices, coupled to a pair of said supply terminals, said devices having conductivity-controlling electrodes and having a common load impedance;

the conductivity-controlling electrode of one of said switching devices being coupled to said first charging circuit between said capacitor and said first electronic device and the conductivity-controlling electrode of the other of said switching devices being coupled to said second charging circuit between said capacitor and said second electronic device;

said second electronic device switching between said two regions of its characteristic in response to variations in the charge on said capacitor;

a buffer signal-repeater having a conductivity-controlling electrode coupled to said other of said switching devices and having output electrodes included in said first charging circuit;

and an output terminal coupled to an output electrode of one of said switching devices.

6. A high-frequency astable nonsaturating multivibrator comprising:

a plurality of power supply terminals;

a single storage capacitor;

a first circuit coupled to one pair of said supply terminals for charging said capacitor in a given direction, said circuit including resistance means and a first electronic device having a substantially constant voltage drop during conduction;

a second circuit coupled to a different pair of said supply terminals for charging said capacitor in the opposite direction, said circuit including resistance means and a second electronic device having a current-voltage characteristic of positive slope in a first region terminating at a current peak $I_p$ followed by a region of negative slope and a second region of positive slope;

a pair of electronic switching devices coupled to a pair of said supply terminals, said devices having conductivity-controlling electrodes and having a common load impedance;

the conductivity-controlling electrode of one of said switching devices being coupled to said first charging circuit between said capacitor and said first electronic device and the conductivity-controlling electrode of the other of said switching devices being coupled to said second charging circuit between said capacitor and said second electronic device;

said second electronic device switching between said first region and said second region at a point on said characteristic representing a current greater than $I_p$ in response to variations in the charge on said capacitor;

and an output terminal coupled to an output electrode of one of said switching devices.

7. A high-frequency astable nonsaturating multivibrator comprising:

power supply terminals;

a single storage capacitor;

a first circuit coupled to one pair of said supply terminals for charging said capacitor in a given direction, said circuit including resistance means and a first electronic device having a substantially constant voltage drop during conduction;

a second circuit coupled to a different pair of said supply terminals for charging said capacitor in the opposite direction, said circuit including resistance means and a second electronic device having a current-voltage characteristic of positive slope in two regions separated by a region of negative slope;

a pair of electronic switching devices coupled to a pair of said supply terminals, said devices having conductivity-controlling electrodes and having a common load impedance;

the conductivity-controlling electrode of one of said switching devices being coupled to said first charging circuit between said capacitor and said first electronic device and the conductivity-controlling electrode of the other of said switching devices being coupled to said second charging circuit between said capacitor and said second electronic device;

said second electronic device switching between said two regions of its characteristic in response to variations in the charge on said capacitor;

said one of said switching devices having an output electrode;

a load impedance coupling said output electrode to one of said supply terminals;

and an output circuit coupled across said load impedance.

8. A high-frequency astable nonsaturating multivibrator comprising:

a plurality of power supply terminals;

a single storage capacitor;

a first circuit coupled to one pair of said supply terminals for charging said capacitor in a given direction, said circuit including a timing resistor and a first electronic device having a substantially constant voltage drop during conduction;

a second circuit coupled to a different pair of said supply terminals for charging said capacitor in the opposite direction, said circuit including a timing resistor and a second electronic device having a current-voltage characteristic of positive slope in two regions separated by a region of negative slope;

a pair of electronic switching devices coupled to a pair of said supply terminals, said devices having conductivity-controlling electrodes and having a common load impedance;

the conductivity-controlling electrode of one of said switching devices being coupled to said first charging circuit between said capacitor and said first electronic device and the conductivity-controlling electrode of the other of said switching devices being coupled to said second charging circuit between said capacitor and said second electronic device;

said second electronic device switching between said two regions of its characteristic in response to variations in the charge on said capacitor;

and an output terminal coupled to an output electrode of one of said switching devices.

No references cited

ROY LAKE, *Primary Examiner.*

S. H. GRIMM, *Assistant Examiner.*